United States Patent [19]
Kim

[11] Patent Number: 6,063,652
[45] Date of Patent: May 16, 2000

[54] SILICON-ON-INSULATOR SEMICONDUCTOR DEVICE IMPROVING ELECTROSTATIC DISCHARGE PROTECTION CAPABILITY AND FABRICATION METHOD THEREOF

[75] Inventor: Young-Gwan Kim, Cheongju, Rep. of Korea

[73] Assignee: LG Semicon Co., Ltd., Chungcheongbuk-Do, Rep. of Korea

[21] Appl. No.: 09/257,299

[22] Filed: Feb. 25, 1999

[30] Foreign Application Priority Data

Nov. 4, 1998 [KR] Rep. of Korea ............... 98-47107

[51] Int. Cl.⁷ .................................................. H01L 21/00
[52] U.S. Cl. ........................... 438/155; 438/154; 257/347
[58] Field of Search ................................. 438/151, 154, 438/155; 257/347

[56] References Cited

U.S. PATENT DOCUMENTS 5,279,978  1/1994  See et al. ................................ 437/34
5,773,326  6/1998  Gilbert et al. ........................ 438/154

OTHER PUBLICATIONS

Wolf, S. Silicon Processing for the VLSI Era, vol. 2: Process Integration. Lattice Press, 1990. pp. 45–47.
Chan, Mansun et al., "Comparison of ESD Protection Capability of SOI and Bulk CMOS Output Buffers", *Proceedings of the 1994 IEEE International Reliability Physics Symposium*, pp. 292–298.

*Primary Examiner*—Olik Chaudhuri
*Assistant Examiner*—Ginette Peralta
*Attorney, Agent, or Firm*—Morgan, Lewis & Bockius LLP

[57] ABSTRACT

A semiconductor device and a fabrication method thereof using a silicon-on-insulator (SOI) technique has an object of improving electrostatic discharge (ESD) protection capability. In order to achieve the object, there are provided the steps of relatively shallowly forming a portion of a buried oxide film in a first region in a silicon substrate for fabricating an integrated circuit device, relatively deep forming the other portion of the buried oxide film in a second region for fabricating an ESD protection device, for thereby fabricating an SOI substrate, and forming the integrated circuit device on a predetermined portion of the first region of the SOI substrate and the ESD protection device on a predetermined portion of the second region.

13 Claims, 3 Drawing Sheets

SILICON-ON-INSULATOR SEMICONDUCTOR DEVICE IMPROVING ELECTROSTATIC DISCHARGE PROTECTION CAPABILITY AND FABRICATION METHOD THEREOF

BACKGROUND OF THE INVENTION

1. Field of the Invention

The present invention relates to a semiconductor device, and more particularly to a silicon-on-insulator (SOI) semiconductor device and a fabrication method thereof that improves an electrostatic discharge (ESD) protection capability.

2. Description of the Conventional Art

Recently, a silicon-on-insulator (SOI) technique has been considered as one of the most effective techniques for improving performance of a very large scale integration (VLSI). According to the SOI technique, circuit elements of the integrated circuit are isolated by a buried oxide film, thereby latch up of transistors does not occur and junction capacitance decreases. Therefore, the SOI semiconductor device has an advantage that, due to the decrease of parasitic capacitance, the operation speed thereof is faster than an integrated circuit device of the same dimension provided on a bulk silicon substrate. Further, a semiconductor device using the SOI substrate is highly applicable to fabrication of a metal oxide semiconductor field effect transistor (MOSFET) under the size of 0.1 μm due to its improvement of a short channel effect, intensive tolerance to radiation, a simple fabricating process and excellent device isolating property.

However, the problem in fabricating the integrated circuit using the SOI substrate is that the buried insulator which enables the integrated circuit device to have excellent property affects the ESD protection capability, which becomes hindrance to replace the bulk silicon substrate by the SOI substrate.

For reference, the comparison of the ESD protection capability of the bulk silicon substrate with that of the SOI substrate was disclosed in "Comparison of ESD Protection Capability of SOI and Bulk CMOS Output Buffers", p. 292–298 of Proceedings of 1994 IEEE/IRPS by Mansun Chan, Seling S. Yuen, Zhi-Jian Ma, Kelvin Y. Hu, Ping K. Ho, and Chenming Hu. As discussed therein the reason of deterioration of the ESD protection capability of the SOI substrate is that since an ESD protecting transistor provided in the SOI substrate includes a buried insulator ($SiO_2$) formed under a drain thereof, p-n junction is not to be formed and thus there is no series resistance, while an ESD protecting transistor in the bulk silicon substrate has p-n junction between the substrate and a drain, thereby forming low series resistance. Further, when heat is generated during the ESD event, heat sink of a silicon oxide film which is the buried oxide film is inferior to the bulk silicon. Therefore, when fabricating the ESD protecting device by using the SOI substrate, as a silicon film on the buried oxidation becomes thick, the ESD protection capability improves. FIG. 1 illustrates the change of an ESD failure voltage in accordance with the thickness of the silicon film described in the above reference, wherein the numbers shown along an axis X indicate thickness of the silicon film formed on the buried insulator of the SOI substrate and the numbers along an axis Y show values of the ESD failure voltage. Here, as it goes to the right side of the axis X, the silicon film becomes thick. As shown therein, the thickness of the silicon film provided on the buried oxide film is proportional to the ESD failure voltage, which means that as the silicon film becomes thick, it becomes more tolerable to the ESD of a higher voltage. Accordingly, the more the ESD failure voltage increases, the higher reliability of the ESD protection capability becomes.

SUMMARY OF THE INVENTION

Accordingly, the present invention is directed to an SOI semiconductor device and a fabrication method thereof that obviate the problems and disadvantages due to the conventional art.

An object of the present invention is to provide an SOI semiconductor device and a fabrication method thereof that improve the ESD protection capability of an integrated circuit device.

To achieve these and other advantages and in accordance with the purpose of the present invention, as embodied and broadly described, in an SOI substrate having a buried oxide film having a relatively deep-formed portion and a relatively shallow-formed portion, an SOI semiconductor device in which an ESD protection device is formed at the relatively deep-formed portion of the buried oxide film while an integrated circuit is formed at the shallow-formed portion thereof.

Also, to achieve above object, there is provided a fabrication method for an SOI semiconductor device, which includes providing a bulk silicon substrate; forming a buried oxide film in a relatively deep part of a predetermined portion of the bulk silicon substrate and a buried oxide film in a relatively shallow part of the other portion thereof; forming an electrostatic discharge (ESD) protection device at a portion which the buried oxide film is relatively deeply formed; and a forming an integrated circuit device at a portion which the buried oxide film is shallowly formed.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

It is noted that an SOI semiconductor device according to the present invention is developed in view of which the ESD protection capability improves as a silicon film is thickly formed.

Figure 1:
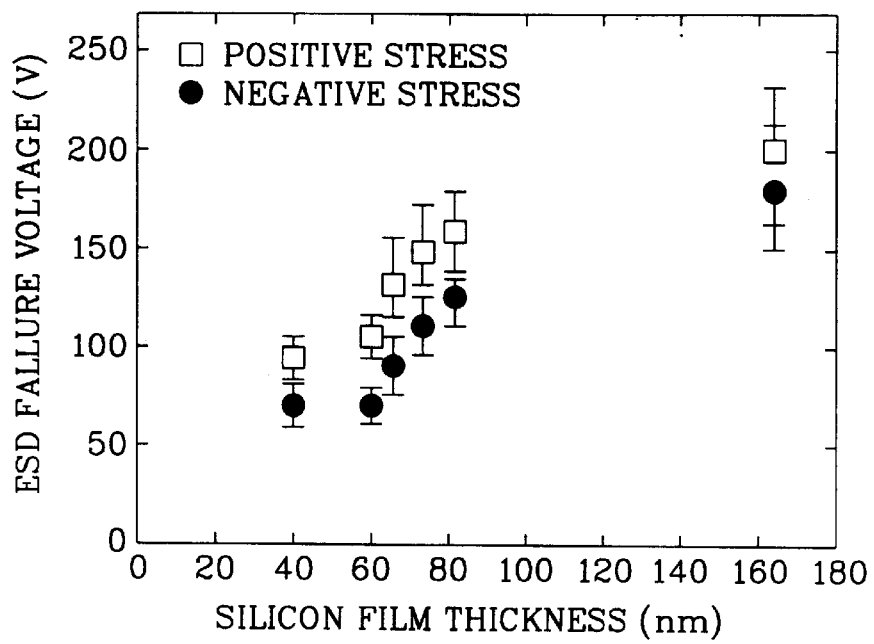
FIG. 1 is a graph illustrating change of an ESD failure voltage in accordance with thickness of a silicon film
Figure 2:
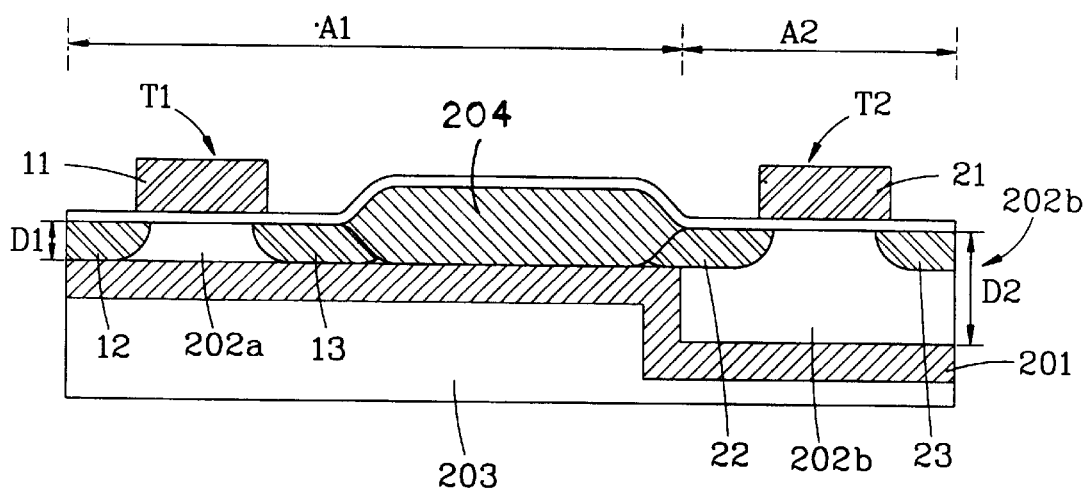
FIG. 2 is a schematic vertical cross-sectional diagram of an SOI semiconductor device according to the present invention.

FIG. 2. is a schematic vertical cross-sectional diagram of an SOI semiconductor device according to the present invention. As shown therein, an SOI substrate 200 is fabricated by which a buried oxide film 201, which is generally a silicon oxide film, is formed in a bulk silicon substrate. The buried oxide film 201 formed in the bulk silicon substrate which electrically isolates silicon films 202a, 202b from a bulk silicon 203 includes a first region A1 and a second region A2 at which there are to be formed integrated circuit elements and an ESD protection device, respectively, the first and second regions A1, A2 having different buried depth. That is, a buried depth D2 of the second region A2 is deeper than a buried depth D1 of the first region A1 and thus the silicon film 202b of the second region A2 is formed thicker than the silicon film 202a of the first region A1. In addition, an integrated circuit device T1 is provided at the first region A1 and an ESD protection device T2 is formed at the second region A2, the devices T1, T2 being electrically isolated from each other. More specifically, the integrated circuit device T1 is provided with a gate electrode 11 formed on the silicon film 202a, and a source 12 and a drain 13 formed at both sides of the gate electrode 11 of the silicon film 202a. While, the ESD protection device T2 includes a gate electrode 21 formed on the silicon film 202b, and a source 22 and a drain 23 formed at both sides of the gate electrode 21 in the silicon film 202b.

The fabrication process for the SOI semiconductor device according to the present invention will be described in detail with reference to FIGS. 3A–3G.

Figure 3A:
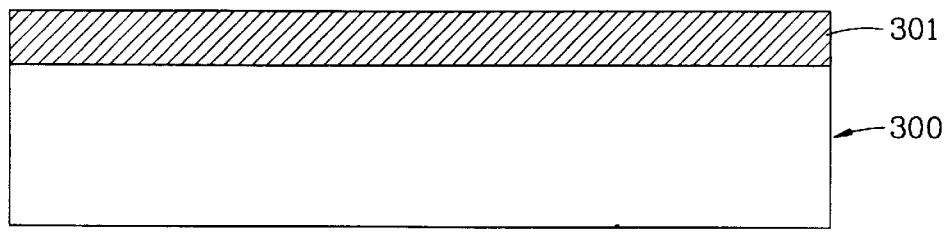
FIGS. 3A through 3G are diagrams sequentially illustrating a method of fabricating an SOI semiconductor device according to the present invention.

First, as shown in FIG. 3A, an insulator 301 formed of a silicon oxide(or nitride) film is provided on a bulk silicon substrate 300. It is desirable to apply a material of the insulator 301 which has a large etching selection ratio with the bulk silicon substrate 300.

Figure 3B:
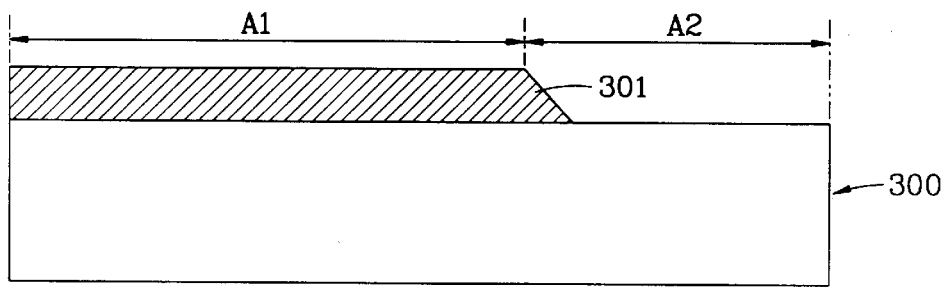

Then, to form an ESD protection device by a photo-etching process, as shown in FIG. 3B, the insulator 301 of the second region A2 is partially removed to thereby form a pattern 301a of the insulator 301 on the first region A1 for placing the integrated circuit device thereon.

Figure 3C:
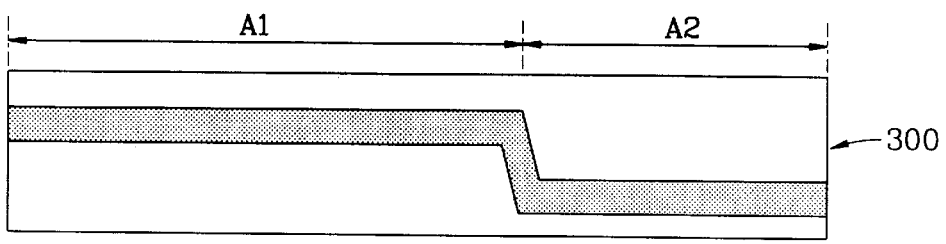

An oxygen ion implantation process is applied to an entire structure of FIG. 3B. Here, it is noted that in the insulator pattern 301a an oxygen ion is relatively shallowly implanted into a portion of the bulk silicon substrate 300 on which the insulator pattern 301a is formed, while the oxygen ion is relatively deep implanted into a portion thereof in the second region A2 on which the insulator pattern 301a is not covered. The resultant structure is illustrated in FIG. 3C. In FIG. 3C, a dotted portion in the bulk silicon substrate 300 is a region having the oxygen ion.

Figure 3D:
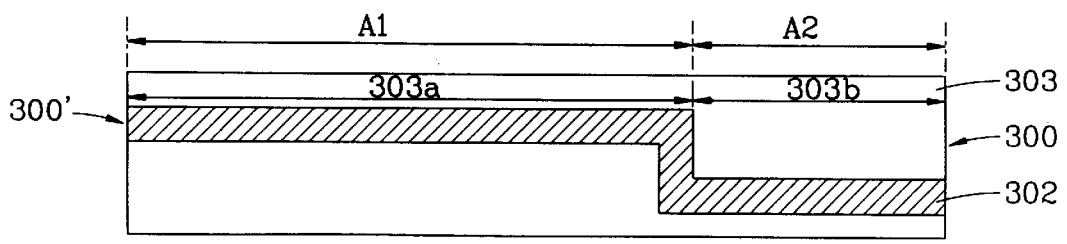

Then, by applying a heat treatment to the substrate 300 of FIG. 3C, the oxygen ion and silicon of the bulk silicon substrate 300 are reacted and thus a silicon oxide film 302 is formed, as shown in FIG. 3D, which results in an SOI substrate 300, the silicon oxide film 302 being called a buried insulator or a buried oxide film. Here, in the bulk silicon substrate 300 semiconductor devices (an integrated circuit device and an ESD protection device) will be formed on an upper portion of the silicon oxide film 302, and the upper portion will be called a silicon film 303. For the convenience of description, a thin silicon film of the first region A1 is expressed in a numeral 303a, while a thick silicon film of the second region A2 to be an area on which the ESD protection device will be formed is expressed in a numeral 303b.

Figure 3E:
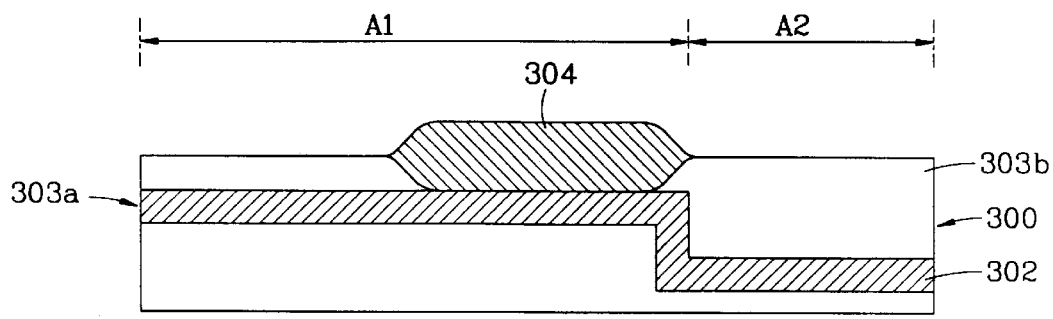

Next, an device isolating insulator 304 to isolate each unit device is shown in FIG. 3E which illustrates an embodiment of forming the field oxide film 304 as the insulator in accordance with a local oxidation of silicon (LOCOS) process. Here, it is noted that the insulator 304 may be formed in a shallow trench isolation process or other processes for isolating devices can be applied.

Figure 3F:
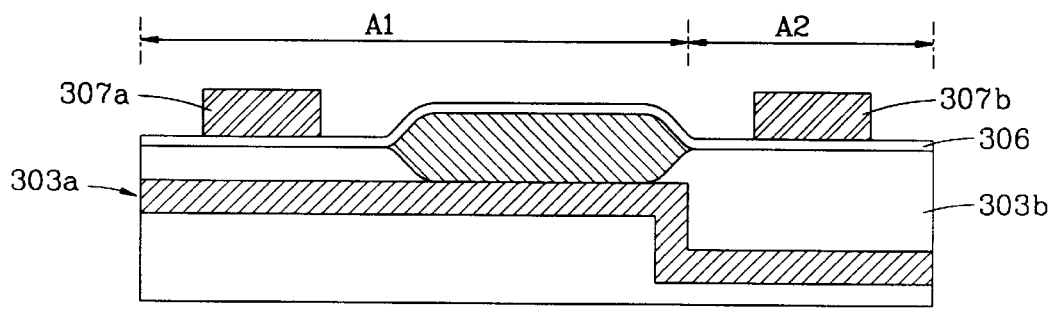

After forming a gate insulator 306 on the silicon films 303a, 303b of FIG. 3E, a gate electrode 307a of the integrated circuit device and a gate electrode 307b of the ESD protection device will be respectively formed on predetermined portions of the gate insulator 306, as shown in FIG. 3F.

Figure 3G:
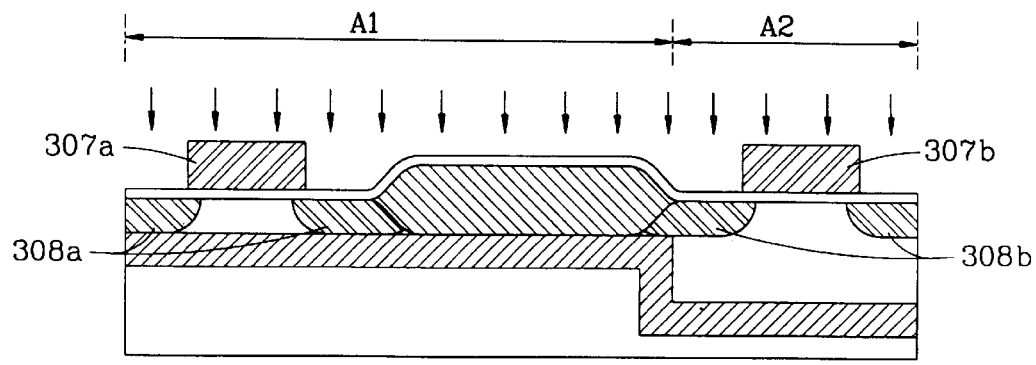

Lastly, in FIG. 3G, a source 308a and a drain 308b are formed by implanting an impurity ion into the both silicon films 303a, 303b of the gate electrode 307a, 307b, respectively, thus the fabrication of the SOI semiconductor device according to the present invention is completed.

As described above, the SOI semiconductor device and the fabrication method of the invention has advantages of the SOI semiconductor device, such as a rapid operation of the integrated circuit device due to decrease of latch-up and parasitic capacitance and an integration increase and excellent device isolation due to improvement of the short channel effect, as well as excellent reliability and performance because the ESD protection capability is improved, which may raise market competitiveness of the products.

It will be apparent to those skilled in the art that various modifications and variations can be made in the SOI semiconductor device and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A method for fabricating a silicon-on-insulator (SOI) semiconductor device, comprising:

fabricating an SOI substrate including a buried oxide film with a staggered configuration such that a deep-formed portion of the buried oxide film is formed in a first portion of the SOI substrate and a relatively shallow-formed portion is formed in a second portion of the SOI substrate;

forming a gate insulator on the SOI substrate;

forming a gate electrode of an electrostatic discharge (ESD) protection device on a fist portion of the gate insulator over the deep-formed portion of the buried oxide film and a gate electrode of an integrated circuit device on a second portion of the gate insulator over the relatively shallow-formed portion of the buried oxide film, the first and second portions of the gate insulator being substantially coplanar; and forming a source/drain of the integrated circuit device and a source/drain of the ESD protection device at sides of each respective gate electrode.

2. The method according to claim 1, further comprising the step of forming a device insulator at a boundary between the relatively deep-formed portion of the buried oxide film and the relatively shallow-formed portion of the buried oxide film with a local oxidation of silicon (LOCOS) process.

3. The method according to claim 2, wherein the step of fabricating an SOI substrate comprises the steps of:

forming an insulator on the bulk silicon substrate, the bulk silicon substrate having a substantially flat upper surface;

forming an insulator pattern by patterning the insulator so that a portion of the upper surface of the bulk silicon substrate is exposed;

implanting oxygen ions into a portion of the bulk silicon substrate that is exposed and a portion of the bulk silicon substrate through the insulator pattern, the oxygen more deeply implanted into the bulk silicon substrate in the portion of the bulk silicon substrate that is exposed as compared to the portion of the bulk silicon substrate covered by the insulator patter; and forming a buried oxide film in the bulk silicon substrate by heat-treating the bulk silicon substrate.

4. The method according to claim 3, wherein the buried oxide film is a silicon oxide film formed by combining the implanted oxygen ions and the silicon of the bulk silicon substrate.

5. A method for fabricating a silicon-on-insulator (SOI) semiconductor device, comprising:

forming an SOI substrate including a bulk silicon substrate and a buried oxide film, the buried oxide film having a staggered configuration such that first and second portions formed at different depths in the bulk silicon substrate such that a relatively thin silicon film is disposed above the first portion of the buried oxide film and a relatively thick silicon film is disposed above the second portion of the buried oxide film;

forming a gate insulator on the SOI substrate;

forming a gate electrode of an electrostatic discharge (ESD) protection device on a first portion of the gate insulator on the relatively thick silicon film and a gate electrode of an integrated circuit device on the second portion of the gate insulator on the relatively relatively thin silicon film, the first and second portions of the gate electrode being substantially coplanar; and forming a source/drain of the integrated circuit device and a source/drain of the ESD protection device at sides of the respective gate electrodes.

6. The method according to claim 5, wherein the step of forming an SOI substrate comprises the steps of:

forming an insulator on the bulk silicon substrate;

forming an insulator pattern by patterning the insulator to expose a portion of an upper surface of the bulk silicon substrate;

implanting oxygen ions into the exposed portion of the bulk silicon substrate and a portion of the bulk silicon substrate covered by the insulator pattern; and forming a buried oxide film in the bulk silicon substrate by heat-treating the bulk silicon substrate.

7. The method according to claim 5, wherein the buried oxide film is a silicon oxide film formed by combining the implanted oxygen ions and the silicon of the bulk silicon substrate.

8. The method according to claim 5, wherein in the step of implanting the oxygen ion, the oxygen ions are relatively shallowly implanted into a portion of the bulk silicon substrate on which the insulator pattern is formed, while the oxygen ions are relatively deeply implanted into an exposed portion of the bulk silicon substrate.

9. The method according to claim 5, further comprising the step of forming a device insulator at a boundary between the relatively thick silicon film and the relatively silicon film before forming the gate insulator.

10. The method according to claim 9, wherein the step of forming the device insulator is performed with a local oxidation of silicon (LOCOS) process.

11. The method according to claim 9, wherein the step of forming the device insulator includes a shallow trench isolation.

12. A method for fabricating a silicon-on-insulator (SOI) semiconductor device, comprising the steps of:

forming an insulator pattern on a substantially flat surface of a silicon substrate such that a first portion of the surface is exposed and a second portion of the surface is covered by the insulator pattern;

implanting oxygen ions into the silicon substrate through the exposed surface and through the insulator pattern;

removing the insulator pattern;

heat treating the silicon substrate to form a buried oxide film by combining the oxygen ions with silicon of the silicon substrate;

forming an integrated circuit device on the first portion of the surface of the silicon substrate; and forming an electrostatic discharge device on the second portion of the surface of the silicon substrate.

13. The method according to claim 12, wherein the oxygen ions being implanted through the first portion of the surface penetrate farther from the surface than the oxygen ions implanted through the insulator pattern and the second portion of the surface.

* * * * *